United States Patent
Kuhn et al.

(10) Patent No.: US 6,773,505 B2
(45) Date of Patent: Aug. 10, 2004

(54) METHOD FOR THE SUBLIMATION GROWTH OF AN SIC SINGLE CRYSTAL, INVOLVING HEATING UNDER GROWTH PRESSURE

(75) Inventors: Harald Kuhn, Erlangen (DE); Rene Stein, Roettenbach (DE); Johannes Voelkl, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 237 days.

(21) Appl. No.: 10/042,060

(22) Filed: Jan. 7, 2002

(65) Prior Publication Data

US 2002/0083885 A1 Jul. 4, 2002

Related U.S. Application Data

(63) Continuation of application No. PCT/DE00/02174, filed on Jul. 4, 2000.

(30) Foreign Application Priority Data

Jul. 7, 1999 (DE) .......................................... 199 31 333

(51) Int. Cl.[7] .............................................. C30B 23/06
(52) U.S. Cl. ...................................................... 117/89
(58) Field of Search ............................... 117/89, 84, 87

(56) References Cited

U.S. PATENT DOCUMENTS

| | | | | |
|---|---|---|---|---|
| 5,441,011 A | * | 8/1995 | Takahaski et al. | ............ 117/84 |
| 5,746,827 A | * | 5/1998 | Barrett et al. | ............... 117/100 |
| 5,895,526 A | * | 4/1999 | Kitoh et al. | ................... 117/84 |

FOREIGN PATENT DOCUMENTS

| | | |
|---|---|---|
| DE | 32 30 727 A1 | 2/1984 |
| DE | 32 30 727 C2 | 2/1984 |
| EP | 0 389 533 B1 | 10/1990 |
| JP | 09 142 995 A | 6/1997 |
| JP | 10 182 296 A | 7/1998 |
| JP | 11-60390 * | 2/1999 |
| JP | 11 060 390 | 3/1999 |

OTHER PUBLICATIONS

Yoo, W. et al.: "Bulk Crystal Growth of 6H–SiC on Polytype–Controlled Substrates Through Vapor Phase and Characterization", Elsevier Science Publishers B.V., 1991, pp. 733–739, no month.

Takahashi, J. et al.: "Influence of the Seed Face Polarity on the Sublimation Growth of α–SiC", Jpn. J. Appl. Phys., vol. 34, Part 1, No. 9A, Sep. 1995, pp. 4694–4698, no month.

Jayatirtha, H. et al.: "Improvement in the Growth Rate of Cubic Silicon Carbide Bulk Single Crystals grown by the sublimation Method", Elsevier Science B.V., 1997, pp. 662–668, no month.

Ohtani, N. et al.: "Development of Large Single–Crystal SiC Substrates", Scripta Technica, 1998, pp. 8–17, no month.

* cited by examiner

*Primary Examiner*—Nadine G. Norton
*Assistant Examiner*—Matthew Anderson
(74) *Attorney, Agent, or Firm*—Laurence A. Greenberg; Werner H. Stemer; Ralph E. Locher

(57) ABSTRACT

A method for the sublimation growth of an SiC single crystal, involving heating up under growth pressure, is described. In the method for the sublimation growth of the SiC single crystal, a crucible holding a stock of solid SiC and an SiC seed crystal, onto which the SiC single crystal grows, is evacuated during a starting phase which precedes the actual growth phase and is then filled with an inert gas, until a growth pressure is reached in the crucible. Moreover, the crucible is initially heated to an intermediate temperature and then, in a heat-up phase, is heated to a growth temperature at a heat-up rate of at most 20° C./min. As a result, controlled seeding on the SiC seed crystal is achieved even during the heat-up phase.

9 Claims, 1 Drawing Sheet

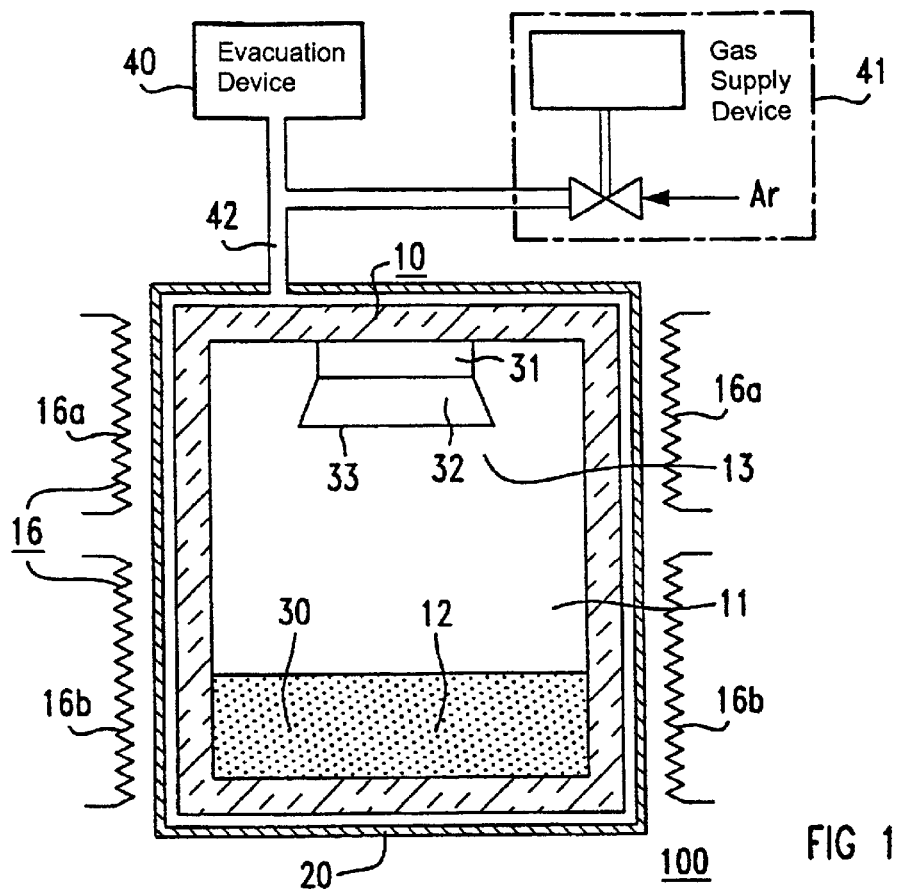
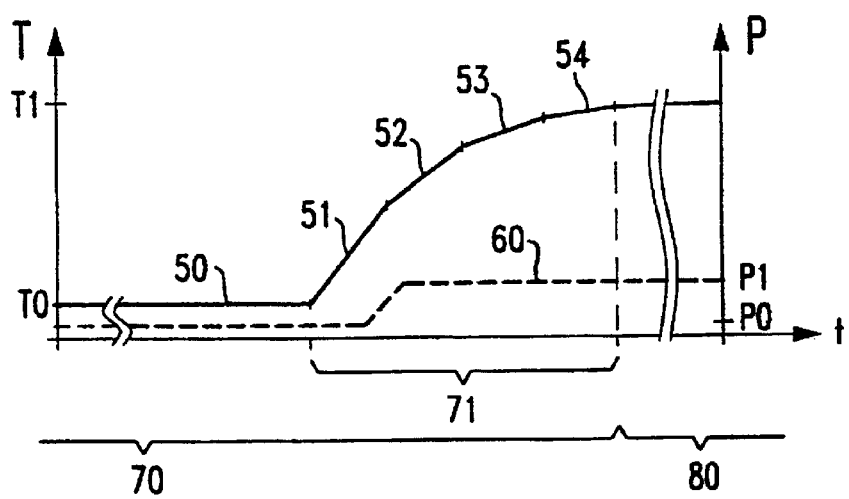

METHOD FOR THE SUBLIMATION GROWTH OF AN SIC SINGLE CRYSTAL, INVOLVING HEATING UNDER GROWTH PRESSURE

CROSS REFERENCE TO RELATED APPLICATION

This application is a continuation of copending International Application PCT/DE00/02174, filed Jul. 4, 2000, which designated the United States.

BACKGROUND OF THE INVENTION

Field of the Invention

The invention relates to a method for the sublimation growth of at least one SiC single crystal, in which a stock of solid SiC is introduced into a storage area of a crucible, and at least one SiC seed crystal is introduced into at least one crystal area of the crucible. The crucible is brought to growth conditions during a starting phase. The SiC single crystal is grown during a growth phase, by the solid SiC of the stock being at least partially sublimed and converted into an SiC gas phase with SiC gas-phase components and the SiC gas-phase components being at least partially transported to the SiC seed crystal, where they are deposited on a growing SiC single crystal. A method of this type for the sublimation growth of an SiC single crystal is known, for example, from German Patent DE 32 30 727 C2.

In the known method, solid silicon carbide (SiC), which is situated in a storage area, is heated to a temperature of between 2000° C. and 2500° C. and is thereby sublimed. The SiC gas phase which forms through the sublimation contains as SiC gas-phase components, inter alia, pure silicon (Si) and carbide compounds $Si_2C$, $SiC_2$ and also SiC. The gas mixture of the SiC gas phase diffuses through a porous graphite wall into a reaction or crystal area in which the SiC seed crystal is situated. Silicon carbide crystallizes out of the SiC gas phase on the seed crystal at a crystallization temperature of between 1900° C. and 2000° C. As well as the gas mixture of the SiC gas phase, there is also an inert gas, preferably argon (Ar), in the crystal area. A growth pressure of between 1 mbar and 5 mbar that is desired in the crystal area is set by suitable introduction of the argon gas. The overall pressure in the crystal area is composed of the vapor partial pressure of the SiC gas phase and the vapor partial pressure of the argon gas.

Before the actual growth phase commences, the crucible, and therefore also the crucible inner zone, are heated to a growth temperature. During the heat-up phase, a heat-up pressure, which is significantly higher than a growth pressure that is subsequently used during the growth phase, is established in the crucible by filling with the inert gas, for example with argon. After the growth temperature has been reached, the pressure is reduced by pumping gas out until a considerably lower growth pressure is reached.

European Patent EP 0 389 533 B1 also describes a method for the sublimation growth of the SiC single crystal, in which, prior to the growth phase, a crucible is heated to a growth temperature of the order of magnitude of 2200° C. A high heat-up pressure of approximately 530 mbar is established at the same time. After the growth temperature has been reached (it should be noted that this differs slightly in the storage area and in the crystal area, so that the temperature gradient required to transport the SiC gas-phase components is established), the pressure in the crucible is then set to a considerably lower growth pressure of approximately 13 mbar.

A further method for the sublimation growth of an SiC single crystal is known from the article Journal of Crystal Growth, Vol. 115, 1991, pages 733 to 739. In this method too, the crucible used for growth is heated up under a high argon gas pressure of approximately 1000 mbar (=atmospheric pressure). As soon as the desired growth temperature has been reached, the argon gas pressure is reduced to the growth pressure. In the sublimation method, the growth pressure may also be varied during the growth phase. The growth pressure may adopt values of between 1.33 mbar and 1000 mbar.

The article in Electronics and Communications in Japan, Part 2, Vol. 81, No. 6, 1998, pages 8–17 describes a method for the sublimation growth of an SiC single crystal in which the heating-up takes place under a high pressure of, for example, 800 mbar. The high pressure is required in order to avoid crystallization at a low temperature, i.e. at a temperature which is lower than the actual growth temperature. This is because otherwise crystallization at low temperature would lead to the formation of an undesirable polytype.

Therefore, all the known methods initially heat up the crucible to the desired growth temperature under a high heat-up pressure, before then reducing the pressure to a much lower growth pressure. However, it has been found that in these methods the crystal quality of the growing SiC single crystal may be impaired and, in particular, an undesirably high rate of defect formation may result.

SUMMARY OF THE INVENTION

It is accordingly an object of the invention to provide a method for the sublimation growth of an SiC single crystal, involving heating under growth pressure which overcomes the above-mentioned disadvantages of the prior art methods of this general type, which ensures improved seeding of the growing SiC single crystal on the SiC seed crystal and therefore allows a higher crystal quality of the growing SiC single crystal. In particular, it is intended to reliably avoid uncontrolled accumulation of SiC gas-phase components on a crystallization surface.

With the foregoing and other objects in view there is provided, in accordance with the invention, a method for the sublimation growth of at least one SiC single crystal. The method includes the steps of introducing a stock of solid SiC into a storage area of a crucible, introducing at least one SiC seed crystal into at least one crystal area of the crucible, and bringing the crucible to growth conditions during a starting phase. The crucible is initially evacuated and then the crucible is filled with an inert gas, until a growth pressure is reached in the crucible, during the starting phase. Furthermore, during the starting phase, the crucible is initially heated to an intermediate temperature and then, in a heat-up phase, starting from the intermediate temperature, the crucible is heated to a growth temperature at a heating rate of at most 20° C./min. The SiC single crystal, during a growth phase, is grown by the stock of solid SiC being at least partially sublimed and converted into an SiC gas phase with SiC gas-phase components and the SiC gas-phase components being at least partially transported to the SiC seed crystal, where the SiC gas-phase components are deposited for growing the SiC single crystal.

The invention is based on the discovery that, in the method according to the prior art which has long been used, the SiC gas phase at the SiC seed crystal is not in thermodynamic equilibrium with the SiC seed crystal in particular during the reduction in pressure to the growth pressure. Consequently, uncontrolled accumulation of SiC gas-phase components at a crystallization surface of the SiC seed crystal may occur during the reduction in pressure. This may have an adverse effect on the seeding of the growing SiC single crystal on the SiC seed crystal that takes place at the beginning of the growth process.

In contrast, seeding of the SiC gas-phase components on a crystallization surface of the SiC seed crystal can be considerably improved by the heating-up of the crucible, of the SiC seed crystal and of the SiC stock to the growth temperature being carried out substantially already at the growth pressure which is subsequently also used during the growth phase. This eliminates the reduction in pressure, which is customary in the prior art, after the growth temperature has been reached and also the uncontrolled growth of the SiC gas-phase components on the crystallization surface of the SiC seed crystal that is caused by this drop in pressure. This is because slight and controlled seeding of the SiC gas-phase components on the crystallization surface of the SiC seed crystal takes place even during the heat-up phase, on account of slow heating-up at a heat-up rate of at most 20° C./min, preferably at a heat-up rate of at most 10° C./min, and a growth pressure in the crucible which has already been established during the heat-up phase. In the present context, the term growth pressure is always understood as being the overall pressure in the crucible during the growth.

The slow heat-up rate while the pressure in the crucible remains the same results in that the SiC gas phase and the SiC seed crystal are virtually always close to the thermodynamic equilibrium. Consequently, a sound base for the SiC single crystal that subsequently grows during the growth phase is created even at this early time. The controlled seeding leads to a good bond between the SiC seed crystal and the growing SiC seed crystal. The resulting bond is virtually free of imperfections, which could otherwise serve as a starting point for the formation of crystal defects. Consequently, the SiC single crystal grows with a very high crystal quality.

In contrast, in the prior art seeding during the heat-up phase is deliberately suppressed by the inert gas which is introduced into the crucible and by the high pressure which the gas is used to establish. The high argon gas pressure prevents diffusion of the SiC gas-phase components to the SiC seed crystal, so that seeding is virtually impossible. As soon as the high pressure is reduced to the considerably lower growth pressure after the growth temperature has been reached, the seeding operation commences immediately. However, since the individual SiC gas-phase components have different diffusion constants in the argon gas, they also pass from the stock to the SiC seed crystal at different rates after the high argon gas pressure has been reduced. Then, the SiC gas phase whose components are not in the concentration appropriate for thermodynamic equilibrium is formed in front of the SiC seed crystal. As a result, however, the incipient formation of crystals is considerably less controlled than under conditions that are close to the thermodynamic equilibrium. It is then impossible to have a controlled influence on the seeding.

A configuration of the method in which the SiC gas phase which forms at the SiC seed crystal, during the starting phase, and in particular during the heat-up phase, is advantageously set in such a way that it has a minimum concentration of SiC gas-phase components which is required for incipient crystal growth on the SiC seed crystal. The concentration can be set in particular by a suitable temperature profile within the crucible. For this purpose, the stock of solid SiC and the SiC seed crystal are preferably brought to different temperatures, so that a low temperature gradient with a temperature drop toward the SiC seed crystal is established.

Then, a slightly supersaturated concentration of the SiC gas-phase components is established at the SiC seed crystal. As a result, first uncontrolled evaporation in particular of silicon out of the SiC seed crystal is prevented, and second growth of crystalline material on the SiC seed crystal with a high growth rate is suppressed. The slight supersaturation only causes weak seeding on the SiC seed crystal. Therefore, this measure additionally assists the seeding which is already desired during the heat-up phase.

It is particularly expedient if a temperature gradient of at most 20° C./cm is established between the storage area containing the stock of solid SiC and the SiC seed crystal. Since seeding on the SiC seed crystal is only to be set in motion during the heat-up phase, only a low transport rate toward the SiC seed crystal is required for the SiC gas-phase components.

This can be achieved, for example, by using a very low temperature difference between the SiC stock and the SiC seed crystal. To facilitate the process engineering and to be able to establish reproducible conditions, it is expedient if a greater temperature difference is established between the SiC stock and the SiC seed crystal and the gas flow of the SiC gas-phase components is then decelerated again by configuration measures in the crucible, which reduce the diffusion rate and/or increase the flow resistance. Both methods lead to a desired low transport rate.

If appropriate, the desired temperature gradient between the storage area and the crystal area can be established by a heater device that is split in two, can be controlled separately and is situated outside the crucible. If necessary, the heater device may also contain more than two separate partial heater devices. In this way, the temperature profile in the crucible inner zone can be controlled with accuracy. The heater device may preferably be of an inductive configuration, although it may also be configured as a resistance heater.

A further embodiment, in which the heat-up rate during the heat-up phase is varied from an initial level, in particular is reduced, is advantageous. The initial level of the heat-up rate may in this case be up to 20° C./min. It is particularly advantageous if the heat-up rate is reduced as the temperature in the crucible inner zone approaches the growth temperature that is ultimately to be established. Toward the end of the heat-up phase, the heat-up rate may in particular amount to only at most 10° C./min, preferably at most 1° C./min.

In a further advantageous variant, the heat-up rate, starting from the initial value, is therefore reduced in steps as the duration of the heat-up phase increases. This slow and, in particular, controlled approach of the temperature to the growth temperature results in the SiC gas phase which is established at the SiC seed crystal being virtually in thermodynamic equilibrium with the SiC seed crystal at any time during the heat-up phase. In this case, the deviation from the thermodynamic equilibrium is just sufficient for the desired seeding process to be brought about. Particularly toward the end of the heat-up phase, the conditions are no longer disrupted by any substantial change in pressure in the crucible. This is because the growth pressure is usually established at the beginning of the heat-up phase or even beforehand, by suitable filling of the evacuated crucible with the inert gas.

However, it is also possible for the heat-up rate to be reduced continuously from the initial level. This can take place either with a constant gradient of the heat-up rate or using any other desired profile that is predetermined for the reduction in the heat-up rate. In general, it is expedient for the reduction in the heat-up rate to be greater the closer the temperature in the crucible inner zone comes to the final growth temperature.

A further embodiment of the method, in which the desired growth pressure is established by filling with at least one of the inert gases argon (Ar), helium (He) and hydrogen (H2), is preferred. In this context, hydrogen is also to be interpreted as being an inert gas. The growth pressure is preferably set to a value of between 1 and 20 mbar. This is achieved by suitable control of the quantity of gas introduced into the crucible. During the growth of α-SiC, it is expedient if the growth pressure is established before the temperature in the crucible exceeds 1800° C., in particular before it exceeds 1600° C. Otherwise, any desired time during the starting phase is in principle suitable for establishing the growth pressure.

Up to the above-mentioned temperature of 1800° C., the sublimation rate of the silicon carbide in the stock and at the seed crystal is virtually negligible, even in vacuum or at only a very low pressure. Therefore, up to this temperature there is no significant formation of SiC gas phase, so that as yet thermodynamic equilibrium between the SiC gas phase and the SiC seed crystal is not of any crucial importance. Since the sublimation rate in vacuum begins to rise slowly beyond a temperature of approximately 1600° C., it may be advantageous for the growth pressure to be established even before 1600° C. is reached.

A value of between 2100° C. and 2300° C. is suitable as a preferred growth temperature that is to be established during the heat-up phase. The range for the growth temperature is primarily suitable for the growth of α-SiC. In contrast, β-SiC is usually grown at a lower temperature, of the order of magnitude of approximately 1800° C. Since a certain temperature profile, with in some cases different temperature values in the respective crucible areas, for example in the storage area and in the crystal area, is present in the crucible inner zone, in this context the term the growth temperature is understood as being a mean temperature across the crucible inner zone.

In a further preferred variant, the intermediate temperature to which the crucible is heated during the starting phase is set to a value of between 1000° C. and 1400° C.

Other features which are considered as characteristic for the invention are set forth in the appended claims.

Although the invention is illustrated and described herein as embodied in a method for the sublimation growth of an SiC single crystal, involving heating under growth pressure, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, sectional view of a device for a sublimation growth of an SiC single crystal having the capability for setting a temperature and a pressure according to the invention; and FIG. 2 is a graph illustrating a temperature and pressure profile during a starting phase of the sublimation growth.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a sectional illustration of a device 100 for the sublimation growth of an SiC single crystal 32, which grows, in particular in the form of a bulk single crystal of α-SiC, on an SiC seed crystal 31. The device 100 contains a crucible 10 with a crucible inner zone 11, which includes a storage area 12 and an opposite crystal area 13.

In the storage area 12 there is a stock of solid SiC 30, which may contain either a compact block of SiC material, in particular of sintered SiC, or pulverulent, polycrystalline SiC. The SiC seed crystal 31, onto which the SiC single crystal 32 grows during the sublimation growth, is disposed in the crystal area 13. An instantaneous growth limit is referred to as the crystallization surface 33. At a start of the sublimation process, the crystallization surface 33 is still at a surface of the SiC seed crystal 31. Later, it in each case forms the surface of the growing SiC single crystal 32 at which the crystal growth is taking place.

Outside the crucible 10 there is a heater device 16, which in the exemplary embodiment shown in FIG. 1 is of two-part configuration. It contains a first partial heater device 16a and a second partial heater device 16b. The heater device 16 can be used to heat the crucible inner zone 11, so that the solid SiC 30 of the stock sublimes and is converted into an SiC gas phase with SiC gas-phase components.

Then, the SiC gas-phase components are transported from the storage area 12 to the crystal area 13 by a diffusion process and a convection process. At the crystal area, a proportion of the SiC gas-phase components is deposited as growing SiC single crystal 32 on the SiC seed crystal 31. To assist the transport and the crystal growth, the heater device 16 is used to establish a slight temperature drop of approximately 5° C. between the storage area 12 and the crystal area 13. The two-part configuration of the heater device 16 is particularly suitable for establishing a temperature gradient of this type.

A further important parameter for the growth process is the pressure prevailing in the crucible inner zone 11. Therefore, the device 100 also includes an evacuation device 40 and a gas-supply device 41, which are connected via a feed/discharge line 42, to a vessel 20 which is able to withstand a vacuum and in which the crucible 10 is located. Since the crucible 10 is not completely sealed, the pressure conditions in the crucible 10 follow those in the interior of the vessel 20 that is able to withstand a vacuum. Therefore, the pressure in the crucible 10 can be established using the pressure in the vessel 20 that is able to withstand a vacuum.

The vacuum-resistant vessel 20 and consequently also the crucible 10 are evacuated or at least brought to an atmosphere with a very low residual pressure of the order of magnitude of at most $10^{-3}$ mbar, using the evacuation device 40. The evacuation usually continues for as long as the entire device 100 is still at room temperature. However, it may in principle also be carried out at a later time. The gas-supply device 41 then enable the vacuum-resistant vessel 20 and the crucible 10 to be filled with an inert gas, in the present case with argon gas. The quantity of gas that is fed to the vacuum-resistant vessel 20 and can be controlled using the gas-supply device 41 then determines the pressure in the crucible inner zone 11.

The growth conditions which are relevant for the sublimation process, in particular an appropriate growth temperature T1 and an appropriate growth pressure P1 in the crucible inner zone 11, can be set using the heater device 16, the evacuation device 40 and the gas-supply device 41. Furthermore, it is also possible to establish a defined temperature drop within the crucible 10.

For high-quality crystal growth, it is of crucial importance to control the growth conditions not only during an actual growth phase 80, but also beforehand. Therefore, FIG. 2 is a diagram illustrating a temperature profile 50 (continuous line) and a pressure profile 60 (dashed line) during a starting phase 70 which precedes the growth phase 80. In the diagram, a time t is plotted on the abscissa, a (crucible) temperature T is plotted on the left-hand ordinate and a (crucible) pressure P is plotted on the right-hand ordinate, in each case in arbitrary units.

The starting phase 70 includes in particular a heat-up phase 71, during which the crucible 10 is heated up to its final growth temperature T1. The starting point for the heat-up phase 71 is an intermediate temperature T0, which may adopt a value of, for example, 1200° C. The intermediate temperature T0 is established during the starting phase 70, at an earlier time that is not shown in the diagram presented in FIG. 2.

During the heat-up phase 71, a heat-up rate is reduced to an increasing extent as the temperature T in the crucible 10 approaches the growth temperature T1. Therefore, during the heat-up phase 71, the temperature profile 50 includes sections 51, 52, 53 and 54 which each have an approximately constant heat-up rate. In the first section 51, the heat-up rate is approximately 10° C./min, in the second section 52 it is approximately 5° C./min, in the third section 53 it is approximately 2° C./min and in the fourth section 54 it is approximately 1° C./min. However, it is also possible for the profile of the heat-up rate to be divided up differently.

The pressure profile 60, which is likewise plotted next to the temperature profile 50, is illustrated by a dashed line in the diagram shown in FIG. 2. The starting point for the pressure profile 60 in the crucible 10 is a residual pressure P0 that is set by evacuating the vacuum-resistant vessel 20 and the crucible 10. The evacuation takes place at a time that is not shown in the diagram and at which the crucible 10 is still at room temperature. At the start of the heat-up phase 71, the vacuum-resistant vessel 20 is filled with argon gas, so that the pressure conditions in the crucible 10 also change accordingly. As a result, the pressure P in the crucible 10 rises from the residual pressure P0 to the growth pressure P1, which is then kept substantially constant for the remaining period of the heat-up phase 71 and also during the following growth phase 80.

Of decisive importance for the process management during the starting phase 70 are, slow heating to the growth temperature T1 with the heat-up rate being reduced in steps, and the establishment of the growth pressure P1 as early as the heat-up phase 71. Consequently, slight seeding on the SiC seed crystal 31 commences even during the heat-up phase 71. In the following growth phase 80, the SiC single crystal 32 then grows with a very good crystal quality on the SiC seed crystal 31 on account of this measure. This is because the seeding in the heat-up phase 71 leads to a particularly flawless transition between the SiC seed crystal 31 and the SiC single crystal 32.

In the exemplary embodiment shown in FIG. 1, the device 100 is only configured to grow a single SiC single crystal 32. This does not constitute any form of restriction, since the device 100 and the method on which it is based can also readily be used to grow a plurality of SiC single crystals.

In principle, it is possible for the SiC single crystal 32 grown to be of any polytype. The method can be used to produce all conventional SiC polytypes, such as for example 4H-SiC, 6H-SiC or 15R-SiC. Cubic SiC of the 3C-SiC polytype can also be grown.

If a misaligned SiC seed crystal with a surface which is structured in step form is used as the SiC seed crystal 31, this may likewise have beneficial effects on the seeding. This is because the steps of the misaligned SiC seed crystal offer preferred starting points for the seeding process, which as a result can proceed in a more defined fashion.

We claim:

1. A method for a sublimation growth of at least one SiC single crystal, which comprise the steps of:

introducing a stock of solid SiC into a storage area of a crucible;

introducing at least one SiC seed crystal into at least one crystal area of the crucible;

bringing the crucible to growth conditions during a starting phase;

initially evacuating the crucible, and then filling the crucible with an inert gas, until a growth pressure is reached in the crucible, during the starting phase;

during the starting phase, initially heating the crucible to an intermediate temperature and then, in a heat-up phase, starting from the intermediate temperature, heating the crucible to a growth temperature at a heating rate of at most 20° C./min; and growing the SiC single crystal, during a growth phase, by the stock of solid SiC being at least partially sublimed and converted into an SiC gas phase with SiC gas-phase components and the SiC gas-phase components being at least partially transported to the SiC seed crystal, where the SiC gas-phase components are deposited for growing the SiC single crystal.

2. The method according to claim 1, which comprises during the starting phase, a minimum concentration of the SiC gas-phase components, above which crystal growth on the SiC seed crystal begins, is established in the SiC gas phase prevailing at the SiC seed crystal.

3. The method according to claim 1, which comprises during the heat-up phase, a temperature gradient of at most 20° C./cm is established between the storage area and the SiC seed crystal.

4. The method according to claim 1, which comprises starting from an initial level, the heat-up rate during the heat-up phase is reduced to a level of at most 10° C./min.

5. The method according to claim 4, which comprises during the heat-up phase the heat-up rate is reduced in steps starting from the initial level.

6. The method according to claim 1, which comprises filling the crucible, after the evacuating step, with at least one inert gas selected from the group consisting of argon, helium and hydrogen.

7. The method according to claim 1, which comprises setting the growth pressure to a value of between 1 and 20 mbar.

8. The method according to claim 1, which comprises setting the growth temperature to a value of between 2100° C. and 2300° C.

9. The method according to claim 1, which comprises during the starting phase the crucible is heated to the intermediate temperature of between 1000° C. and 1400° C.

* * * * *